United States Patent [19]
Ikeya

[11] Patent Number: 6,027,355
[45] Date of Patent: Feb. 22, 2000

[54] SOCKET APPARATUS FOR REMOVABLY LOADING ELECTRIC PARTS

[75] Inventor: Kiyokazu Ikeya, Shizuoka, Japan

[73] Assignee: Texas Instruments Incorporated, Dallas, Tex.

[21] Appl. No.: 09/089,612

[22] Filed: Jun. 3, 1998

[30] Foreign Application Priority Data

Jul. 4, 1997 [JP] Japan .................................. 9-195055

[51] Int. Cl.[7] ................................................ H01R 11/22
[52] U.S. Cl. .......................................................... 439/268
[58] Field of Search .................................. 439/268, 263, 439/264

[56] References Cited

U.S. PATENT DOCUMENTS

| | | | |
|---|---|---|---|
| 4,630,875 | 12/1986 | Korsunsky | 439/264 |
| 5,123,855 | 6/1992 | Petersen . | |
| 5,213,531 | 5/1993 | Matsuoka et al. . | |
| 5,320,550 | 6/1994 | Uratsuji et al. . | |
| 5,454,727 | 10/1995 | Hsu | 439/263 |
| 5,482,471 | 1/1996 | Mori et al. . | |
| 5,641,945 | 6/1997 | Abe et al. . | |
| 5,800,194 | 9/1998 | Yamagishi | 439/264 |

*Primary Examiner*—Neil Abrams
*Assistant Examiner*—Javaid Nasri
*Attorney, Agent, or Firm*—Russell E. Baumann; Richard L. Donaldson

[57] ABSTRACT

A plurality of contacts (6) are arranged on a base (2) in conformity with a pattern of solder ball terminals (11) of a BGA package (9). Each contact (6) has a pair of arms (6a and 6b) which flexibly open or close to effect contact disengagement or compressive contact engagement sandwiching the solder balls of the BGA package. A slide member (4) which is capable of sliding in the opening and closing direction of the arms (6a and 6b) of the contacts (6) is provided on the base and is constructed in such a way that the arms (6a and 6b) of each contact run through the slide member (4). A lead guide (7) is vertically slidable on positioning parts (2a) depending downwardly from the base (2) for receiving lead portions (6d) in upper, relatively larger bore portions (70a) and guiding the lead portions as the body is mounted on a circuit board substrate.

6 Claims, 16 Drawing Sheets

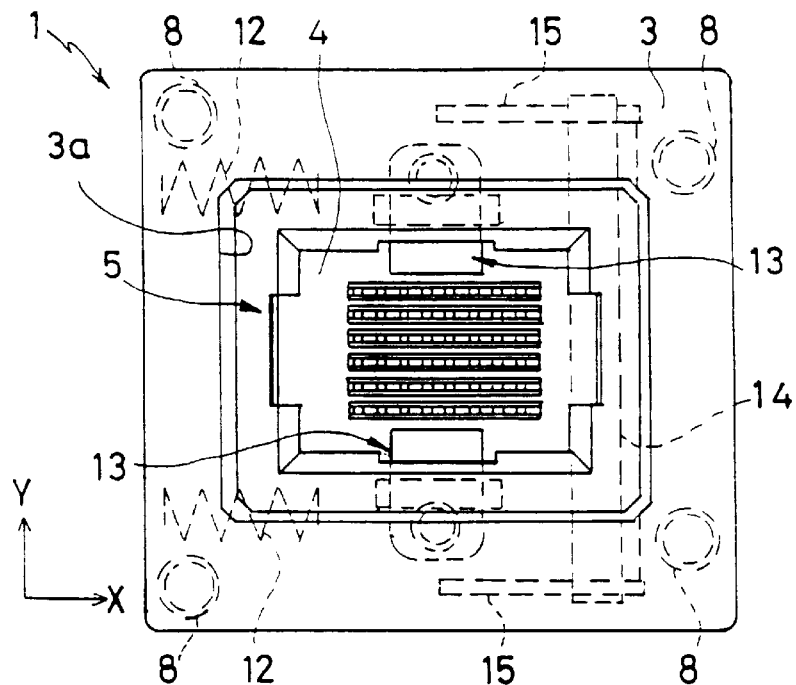
FIG. 1A
FIG. 1B
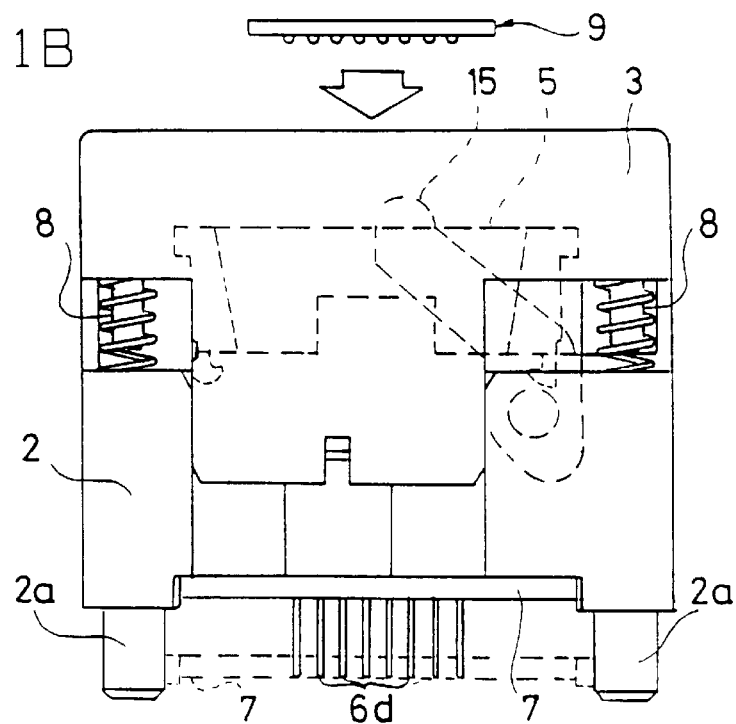

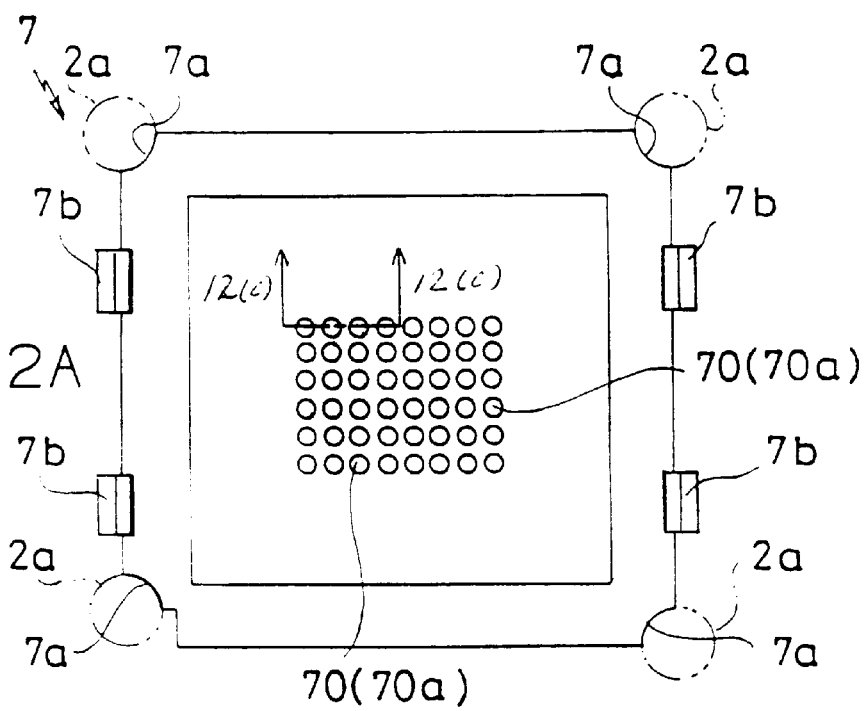
FIG. 12A
FIG. 12B
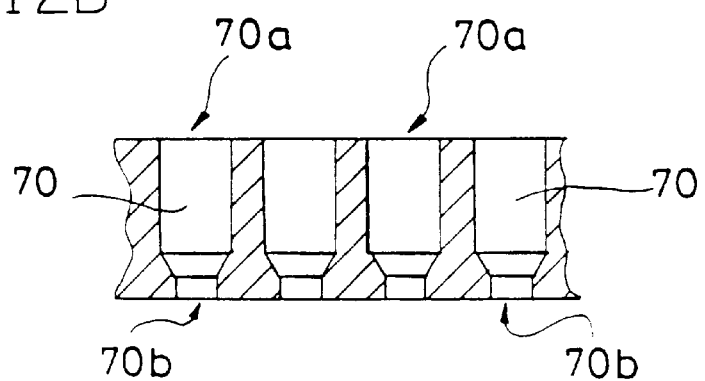
FIG. 12C

FIG. 16A
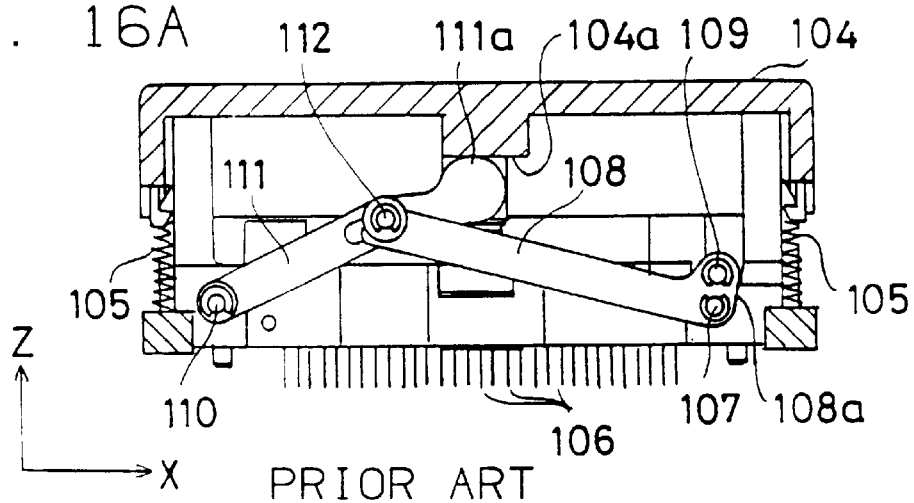
PRIOR ART
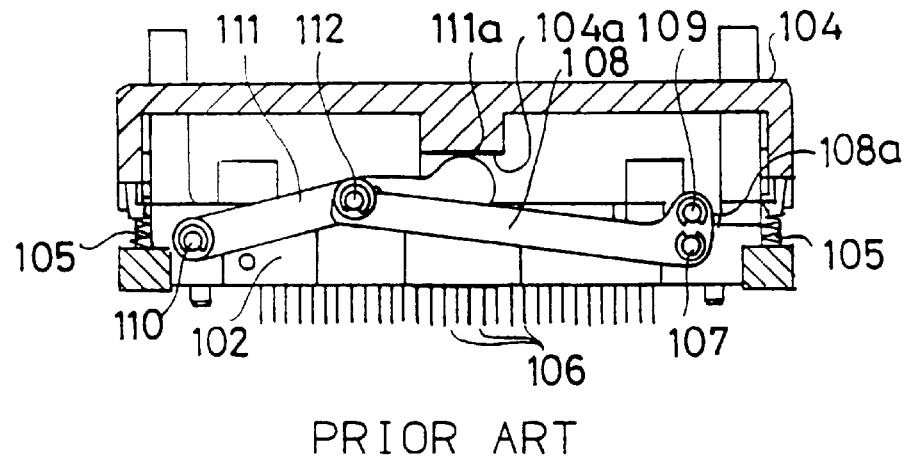
PRIOR ART
FIG. 16B
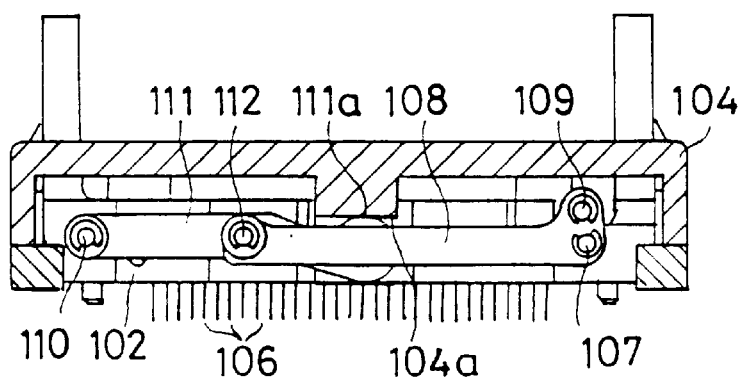
PRIOR ART
FIG. 16C 6,027,355

SOCKET APPARATUS FOR REMOVABLY LOADING ELECTRIC PARTS

FIELD OF THE INVENTION

This invention relates generally to a socket apparatus which removably mounts an electric part having a large number of terminal leads to thereby electrically connecting each lead with external testing equipment and more particularly to a socket which is especially useful as a socket for BGA (Ball Grid Array) packaging.

BACKGROUND OF THE INVENTION

During the manufacturing procedures of semiconductor integrated circuit packages the IC chip, sealed with resin, is typically subjected to a reliability test, called a burn-in test and an electric property test prior to its shipment, in order to identify good products and unsatisfactory products. Input and output characteristics, pulse characteristics, noise leeway and the like of the IC chips are tested in the electric property test. In the burn-in test, the IC packages that have passed the electrical property test are arranged in an oven and made to operate for a certain period of time at a high temperature, such as 125° C., and under a power voltage which is about 20 percent higher than the rated value. Products which fail the burn-in test are discarded as being unsatisfactory, with only IC packages which perform as intended being shipped out as satisfactory products. In recent years, the BGA package, which has a matrix-like or zigzag arrangement of terminal leads comprising ball-shaped solder bodies on the reverse side of the package, has come into wide use as the IC package of the new surface loading type. The BGA package has the advantage of increasing the width of the terminal pitch with small outside dimensions, with the terminal leads being sufficiently robust that they do not deform upon contacting other parts. FIGS. 14–16 show a socket for burn-in tests made according to the prior art used for loading such BGA packages. As shown in FIGS. 14(a), 14(b), FIGS. 15(a) and 15(b), socket 101 has a square base 102 made of resin and a slider 103 for loading the BGA package arranged for movement in the horizontal direction for loading the BGA package (not shown in the drawing) on base 102. A cover 104, made of resin and having an opening therethrough for passage of BGA packages is provided at the top of base 102 vertically movable relative to base 102 by means of compression coil springs 105 disposed at each of the four corners of the base and cover. A hole (not shown in the drawings) corresponding to each terminal lead of the BGA package is formed through slider 103 and base 102. In addition, an electrical contact 106 is arranged to run through the holes of slider 103 and base 102 for the compressive connection of the terminal lead of the BGA package. Each contact 106 is made of an oblong metal member with a pair of arms 106a, 106b provided at one end. Each contact 106 is vertically fixed on base 102 with arms 106a and 106b extending upwardly as shown in FIG. 15(b). With reference to FIG. 14(b), on the other hand, contact 106 is formed with a protrusion, not shown in the drawing, provided on arm 106a of arms 106a and 106b arranged adjacent to each other, and as the protrusion becomes engaged with a groove 103b formed in a partition wall 103a of slider 103, arms 106a and 106b are opened. A slide mechanism for moving slider 103 in parallel with the bottom of base 102 is provided on both sides of slider 103. The slide mechanism comprises a respective lever member 108, approximately in the shape of an L, with a long arm rotatably mounted at each end of a shaft 107 extending along the edge (on the right side edge in FIG. 14(a)) of base 102 and a short arm 108a of lever member 108 rotatably linked to a shaft 109 (see FIGS. 16(a)–16(c)) which engages the edge of slider 103 which is disposed in parallel relation with the top of shaft 107. In addition, a respective lever member 111 is rotatably mounted at each end of a shaft 110 which extends along the other, left, side edge of base 102. The distal tip of lever member 108 is slidably connected to lever member 111 through a slot (not shown) formed in lever 111 intermediate to the ends thereof. When cover 104 is not being depressed, tip 111a of lever member 111 engages protrusion 104a on the top wall of cover 104. A compression coil spring 113 is provided in the vicinity of shaft 107 for placing a bias on slider 103, toward the right as seen in FIG. 14(a).

In a socket 101 made as described above, if cover 104 is pressed down from the position shown in FIG. 15(a), lever members 108 and 111 pivot toward base 102 and, along with movement of lever member 108, shaft 109 engages slider 103 and moves in the X– direction, to the left as seen in the drawing. As a result of this (see FIG. 15(b), arm 106a of each contact 106 is moved and opens by being engaged with groove 103b of partition wall 103a of slider 103. If, in this state, the BGA package is dropped into the holding part 103c of slider 103, each lead terminal of the BGA package enters between arms 106a and 106b of a respective contact 106. When the downward force on cover 104 is removed, lever members 108 and 111 rise and slider 103 returns in the X+ direction due to the bias of compression spring 113 with arms 106a and 106b of each contact 106 being closed with a respective lead terminal of the BGA package sandwiched therebetween. Because of this, it becomes possible to electrically connect each lead terminal of the BGA package to a respective contact 106.

In recent years, a BGA package with a pitch between the solder balls at approximately 0.75 mm has been developed. However, there arise various problems in the burn-in test using the conventional socket 101 as described above on BGA packages having such a small pitch. In the conventional socket 101, the pressure contacts of arms 106a and 106b of contact 106 are offset and not arranged in such a way as to face each other, with a consequence that it is difficult to firmly sandwich the small solder balls by arms 106a and 106b. As a result, it is not possible to satisfactorily guarantee the electrical connection between arms 106a and 106b and the solder balls. Further, where an oxide film has formed on the surfaces of the solder balls of the BGA package the danger of the electrical connection between arms 106a and 106b and the solder balls becoming unsatisfactory is exacerbated. Another problem relates to the connecting or lead portion of contacts 106 in this type of socket which are inserted into holes formed in the circuit substrate, followed by soldering to thereby electrically effect connections with the circuit substrate. In the case of loading a BGA package having such a small pitch as described above, there is a problem in that it is difficult to insert the connecting parts of contacts 106 into the holes of the circuit substrate due to the extremely small size of the pitch between contacts 106 particularly if one or more leads are slightly bent. Another disadvantage relates to the large number of components required for driving the slider, including lever members 108, 111 and shafts 107, 109 and 110 with a result that the construction becomes complicated and the manufacturing costs are adversely affected.

SUMMARY OF THE INVENTION

An object of the present invention is to provide socket apparatus which overcomes the limitations of the prior art described above. Another object of the invention is the provision of a socket which is capable of carrying out a good electrical connection for an electrical part having small connecting terminals of a small pitch. Yet another object of the invention is the provision of socket apparatus which can be easily loaded on the circuit substrate and whose structure is simple.

Briefly, socket apparatus made in accordance with the invention comprises a main socket body for removably loading an electric part having an arrangement of lead terminals in a prescribed pattern, a plurality of contact makers arranged on the main socket body in conformity with the pattern of terminal leads of the electric part and having a pair of arm-shaped contacts capable of flexibly opening and closing in compressive engagement holding each respective terminal lead of the electric part. A contact opening and closing mechanism opens and closes the arm-shaped contacts of the contact maker in which the arm-shaped contacts of the contact maker are formed in such a manner that the pressure contact parts that compressively contact the lead terminals of the electric part face each other and that an engagement part is provided in such a way as to engage with the opening and closing mechanism of the contact. The terminal leads of the electrical part are firmly sandwiched by the respective arm-shaped contacts as a result of the face to face relation of the pressure contacts of the arm-shaped contact thereby obtaining a state of satisfactory electrical connection. In addition, this arrangement can accommodate the small or fine pitch as the adjacent contact makers can be arranged in close proximity. According to a feature of the invention, in the event that an oxide film has formed on the terminal leads of the electric part, the film can be broken by protrusions provided on the pressure contact parts of the contact maker, with a result that a satisfactory electrically connected state can be obtained. According to another feature of the invention, positioning parts project from the bottom, i.e., the side of the main socket body facing the substrate for receipt in positioning bores formed in the substrate. A contact maker guide member is provided which can slide along the positioning parts. The guide member has a guide part for guiding the lead portion of the contact makers that project from the bottom of the main socket body to the loading position so that in the event that one or more lead portions of the contact makers are slightly bent, their tips will be guided to the correct position, thereby making it easier for the socket to be loaded on the circuit substrate.

According to a feature of the invention, a slide member is disposed for sliding motion in the opening and closing direction of the arm-shaped contacts of the contact makers on the main socket body. A through hole for accommodating each arm-shaped contact of the contact makers is formed in the slider along with an engagement groove that engages with the engagement part of one of the arm-shaped contacts. A spring member is provided for placing a spring bias on the slide member in the closing direction of the arm-shaped contacts of the contact makers while a lever member is rotatably mounted on the slide member for moving the slide member against the spring bias. According to another feature of the invention, a removable positioning member is provided for placement of an electric part in a predetermined position upon loading thereof. The positioning member can be easily exchanged, thereby making it possible to load different kinds of electrical parts of different sizes. According to an aspect of the invention, moreover, the positioning member can be taken out even after loading of socket on the circuit substrate. According to yet another feature of the invention, the pair of contacts of the contact makers are formed by bending respective metal members with the contacts facing each other and are accurately disposed in face to face relation by adjusting the bending angle.

BRIEF DESCRIPTION OF THE DRAWINGS

The present invention will be more fully understood and appreciated from the following detailed description taken in conjunction with the drawings in which:

FIG. 1(a) is a top plan view showing a socket made in accordance with a preferred embodiment of this invention;

FIG. 1(b) is a front elevational view of the FIG. 1 socket shown with a BGA package;

FIG. 3(a) is a front elevational, FIG. 3(b) a bottom view, and FIG. 3(c) is a side elevational view;

FIG. 4(a) is a top plan view, FIG. 4(b) is a front elevational view, and FIG. 4(c) is a partial cross sectional view taken along line 4(c)–4(c) in FIG. 4(a);

FIG. 5(a) is a left side elevational view, FIG. 5(b) is a front elevational view, and FIG. 5(c) is a right side elevational view;

FIGS. 12(a)–12(c) show the structure of a lead guide, with FIG. 12(a) being a top plan view, FIG. 12(b) a front elevational view, and FIG. 12(c) a cross sectional view taking along line 12(c)—12(c) in FIG. 12(a);

FIGS. 16(a) through FIG. 16(c) are explanatory cross sectional views taken on line 16—16 of FIG. 14(a) showing the operation of the prior art socket.

DETAILED DESCRIPTION OF PREFERRED EMBODIMENT

Figure 3A:
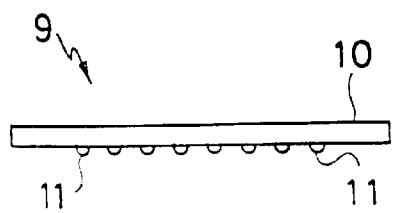
FIGS. 3(a)–3(c) show the external appearance of a BGA package used with the invention, where
Figure 3B:
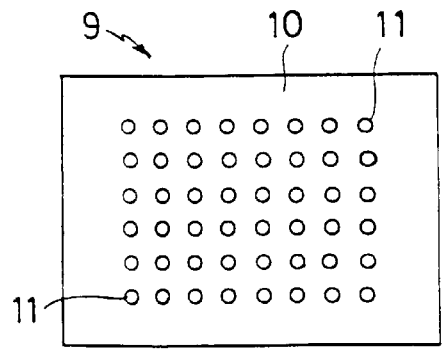
Figure 3C:
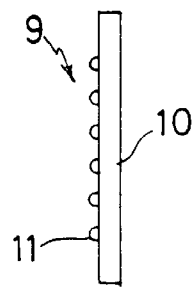

The socket shown in this embodiment generally comprises a base 2 as the main socket body, a cover 3, a slide member 4 provided on base 2, and an adaptor 5 as a positioning member provided on slide member 4. These components are formed of suitable resinous material such as polyether imide, or the like. Base 2 is to be fixed to a circuit substrate, for example, a printed substrate, not shown in the drawing, and may be formed in a rectangular configuration, by way of example. On the bottom of base 2, i.e., the connecting side relative to the substrate, cylindrical positioning parts 2a extend downwardly from each of the four corners of the base for insertion into positioning holes (not shown in the drawing) provided on the circuit substrate. Contacts 6 used as contact makers are arranged according to a prescribed pattern on base 2 as will be described below and their connecting or lead part 6d are made to extend from the bottom of base 2 as shown in FIG. 1(b). At the bottom of the base 2, moreover, a lead guide 7 is provided as a contact maker guide member to be described below. A cover 3 is disposed in a movable fashion relative to base 2. An opening 3a for loading a BGA package 9 is formed approximately at the center thereof. Cover 3 is biased in a direction away from base 2 by compression coil springs 8 that are disposed at each of the four corners of base 2. As shown in FIGS. 3(a) through 3(c), BGA package 9 used with the invention has a plurality of solder ball terminal leads 11 formed in a prescribed pattern on one of the faces of the substrate 10 which is the main body portion of the package. By way of example, the diameter of the solder balls is approximately 0.33 mm and the pitch between the adjoining solder balls 11 is approximately 0.75 mm.

Figure 4A:
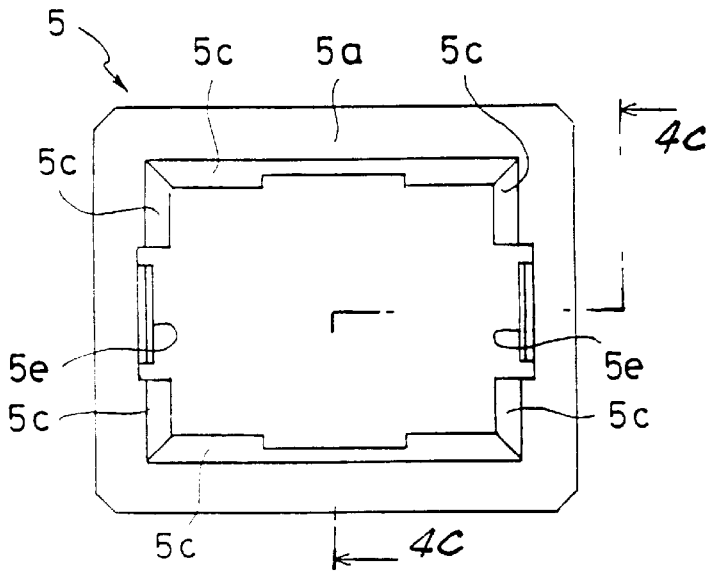
FIGS. 4(a)–4(c) show the structure of an adaptor used in the FIGS. 1, 2 socket, where
Figure 4B:
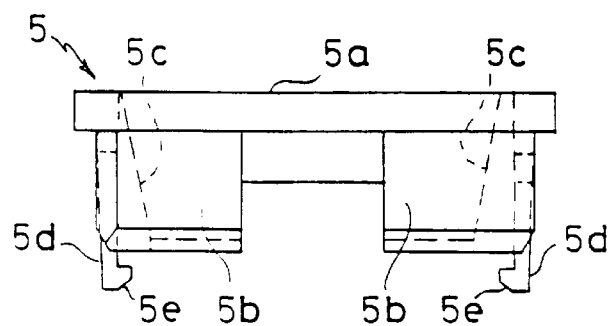
Figure 4C:
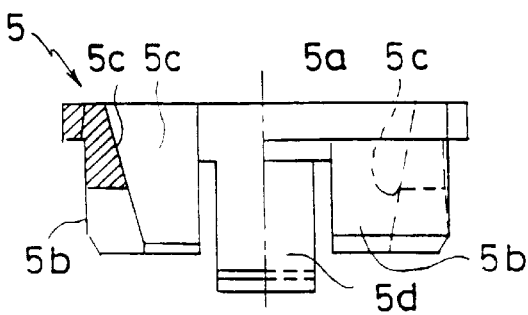

As shown in FIG. 4(a), adaptor 5 of socket 1 comprises a frame 5a which is rectangular in shape and downwardly depending installation part 5b which is integrally formed at each of the four corners of frame 5a and constructed in such a way as to be detachable relative to slider 4. The outer edge part of frame part 5a of the adaptor has a length and width which is somewhat smaller than the length and width of the opening part 3a of cover 3 and an inclined surface portion 5c is formed inside the mounting part 5b for determining the mounting position of the BGA package. As shown in FIGS. 4(a) and 4(b), inclined surface portions 5c tilt from frame 5a of adaptor 5 toward the center and the length and width of the opening formed by each tilted part 5c is made somewhat larger than the dimensions of the BGA package. Moreover, mounting part 5b of adaptor 5 is so formed as to be able to be inserted into holding part 40 (refer to FIGS. 8 through 10) of slide member 4 which will be described below. On the short side of frame 5a of adaptor 5, a pair of integrally formed stop elements 5d extend in the vertical direction relative to frame 5a, with a claw 5e being formed at the distal tip of each stop element 5d. When mounting part 5b of adaptor 5 has been inserted into holding part 40 of slide member 4, each stopping part 5d is inserted into a respective insertion hole 41 (refer to FIG. 7(a)) of slide member 4 and adaptor 5 is retained by the engagement between each claw 5e and the edge 41a of the respective insertion hole 41 of slide member 4. Meanwhile, engagement between each claw 5e and edge 41a of the respective insertion hole 41 of slide member 4 is broken when the engaging part 5d of the adaptor 5 is moved outwardly, thereby making it possible to easily detach adaptor 5 from the holding part 40 of the slide member 4. According to such a construction, adaptor 5 can be easily exchanged, thereby making it possible for BGA packages of different sizes to be loaded. Accordingly to this embodiment, it becomes possible to take out the adaptor from the slider even after the socket has been loaded on the circuit substrate.

Figures 5A, 5B, 5C:
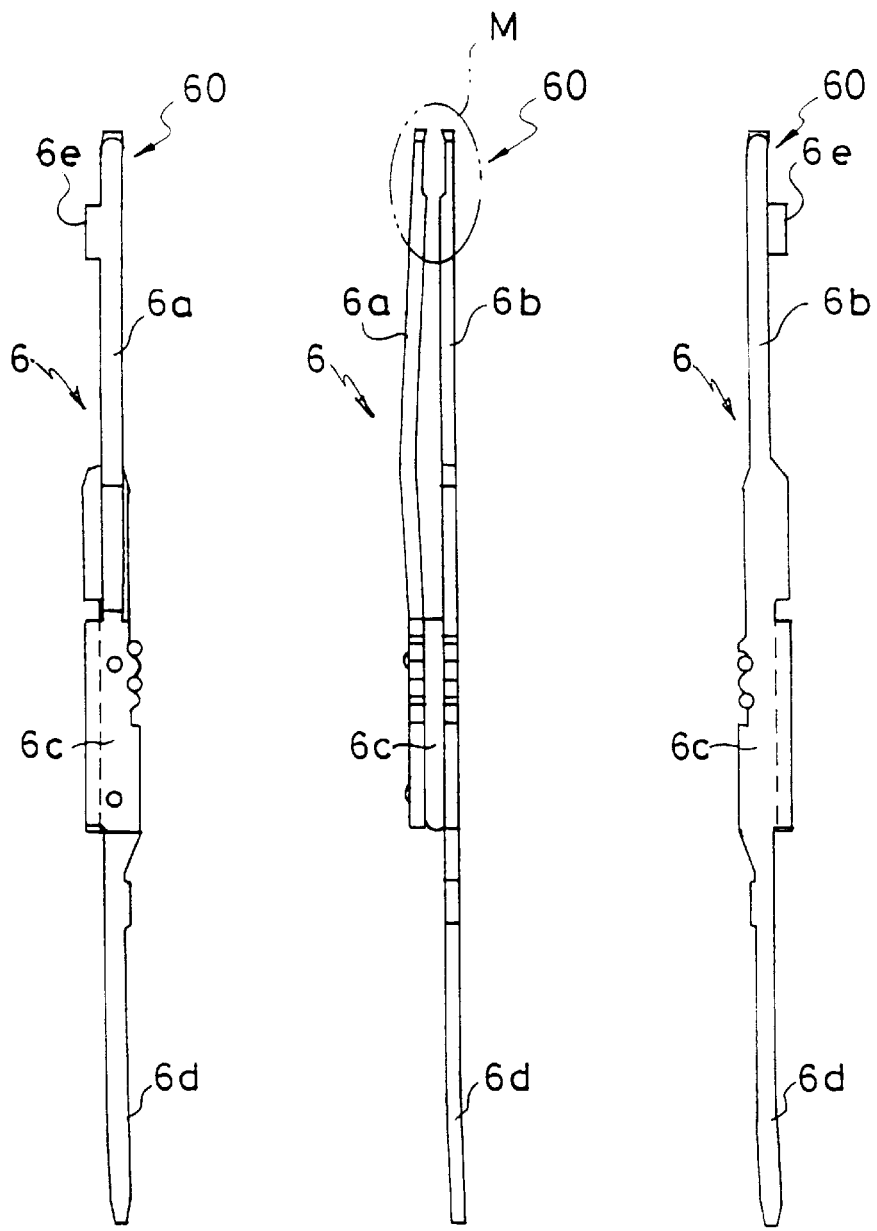
FIGS. 5(a)–5(c) show the structure of a contact maker used in the FIGS. 1, 2 socket, where
Figure 6A:
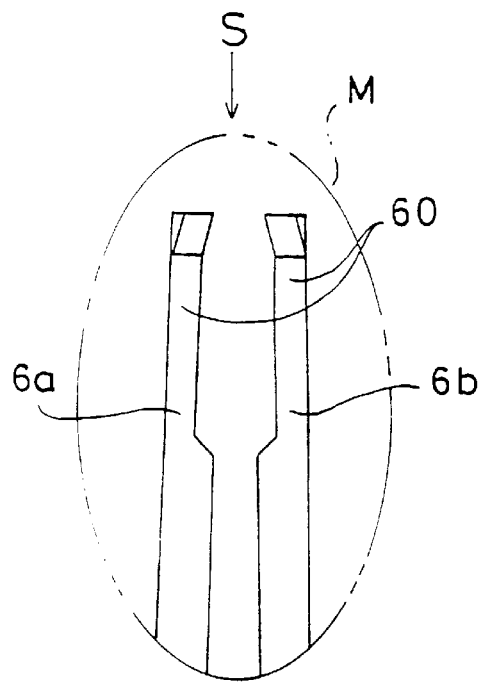
FIG. 6(a) is an enlarged view of portion M of FIG. 5(b)
Figure 6B:
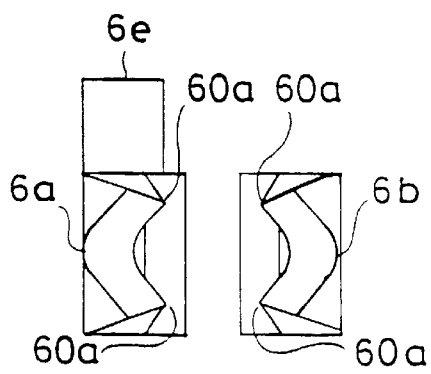
FIG. 6(b) is an enlarged view of the contact portion in FIG. 6(a) as viewed in the direction indicated by an arrow S.

As shown in FIGS. 5(a) through 5(c), contacts 6 in this embodiment are composed of oblong members made of a suitable metal such as copper or the like and each contact has arms 6a and 6b as a pair of arm-shaped contacts analogous to the contacts described in the conventional example described above. Contact 6 is advantageously integrally formed from a metal plate. The base portion is bent into a U-shape configuration, thereby forming a mounting part 6c for fixedly mounting to base 2, with a pair of arms extending upwardly as seen in the figure. One arm 6b is formed in such a way as to extend straight and the other arm 6a is bent somewhat like a bow. On the opposite side of arm 6b of mounting part 6c, a lead part 6d for connection with an external terminal is formed in such a way as to extend along the same straight line but in the opposite direction as arm 6b. A protrusion (engaging part) 6e which is to be engaged with an engaging groove 4b provided on partition wall 4a of slide member 4 is provided on arm 6a. As shown in FIG. 6(b), arms 6a and 6b of the contact are aligned facing each other. At the pressure contact part 60 at the tips of arms 6a and 6b, protrusions 60a are formed by bending the center of the angular part at its tip outwardly forming a concavity between protrusions 60a in such a way that the right and left portions are symmetrical. Because of such a construction, solder balls 11 of the BGA packages are engaged symmetrically between the right and the left portions by protrusions 60a of the pressure contact part 60 of each arm as shown in FIG. 6(c).

Figure 2:
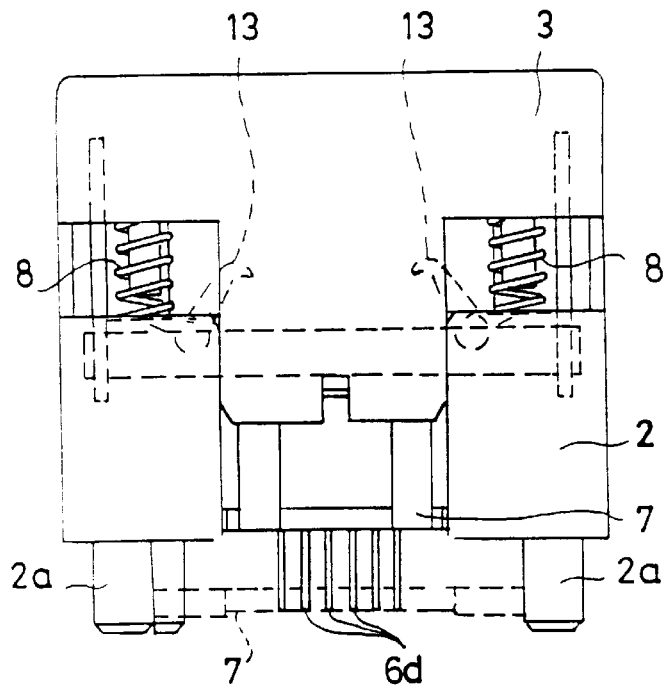
FIG. 2 is a side elevational view of the FIG. 1 socket.
Figure 7A:
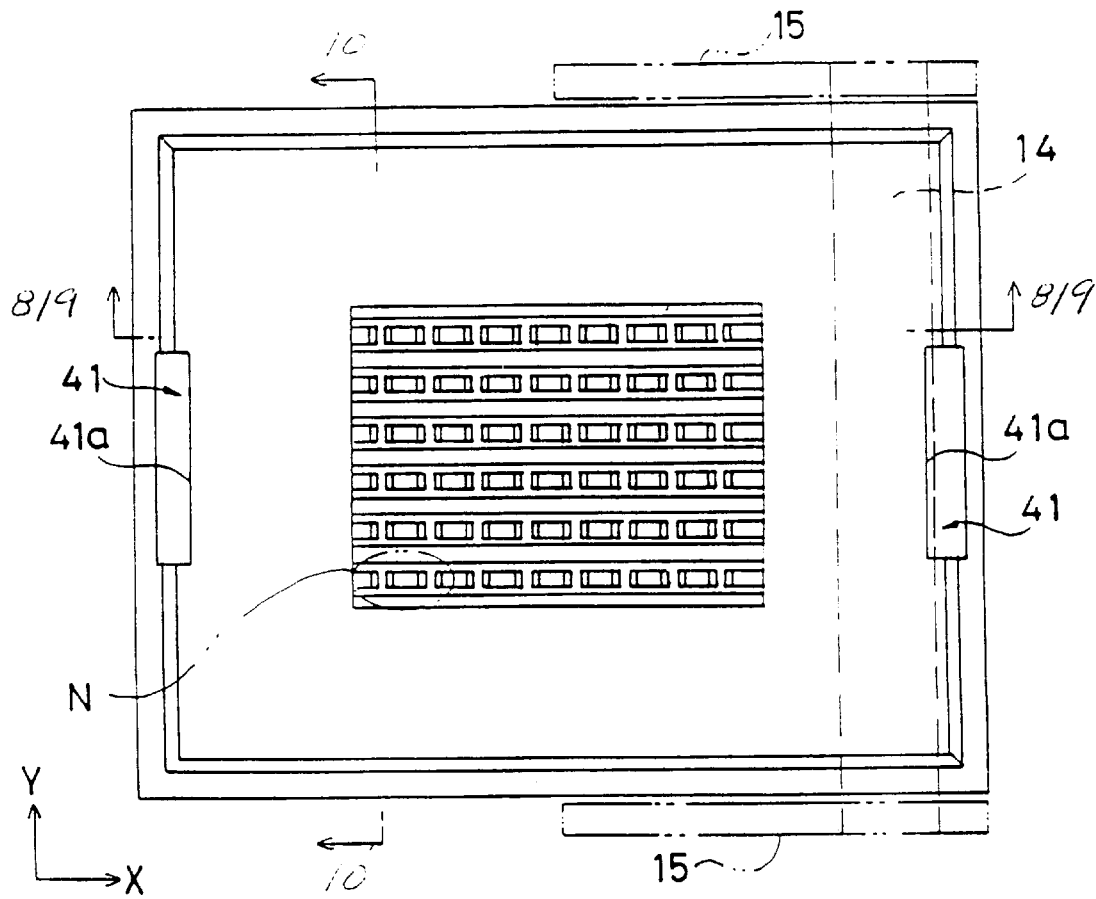
FIG. 7(a) is a top plan view showing the exterior appearance of a slider and FIG. 7(b) is an enlarged view of portion N of FIG. 7(a)
Figure 7B:
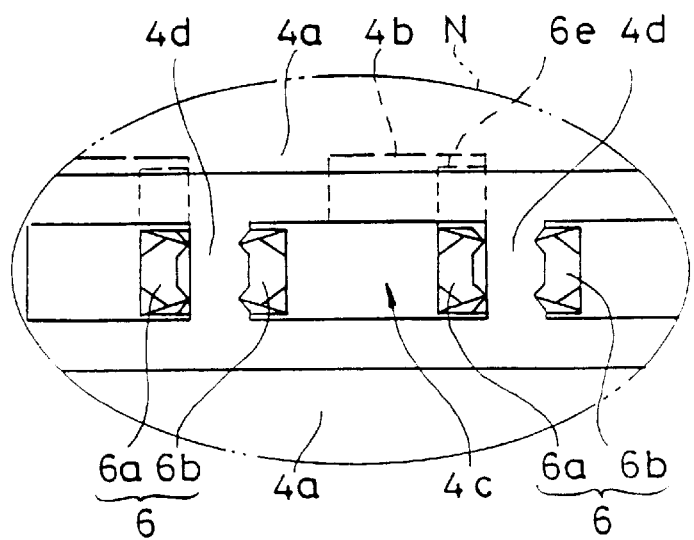
Figure 8:
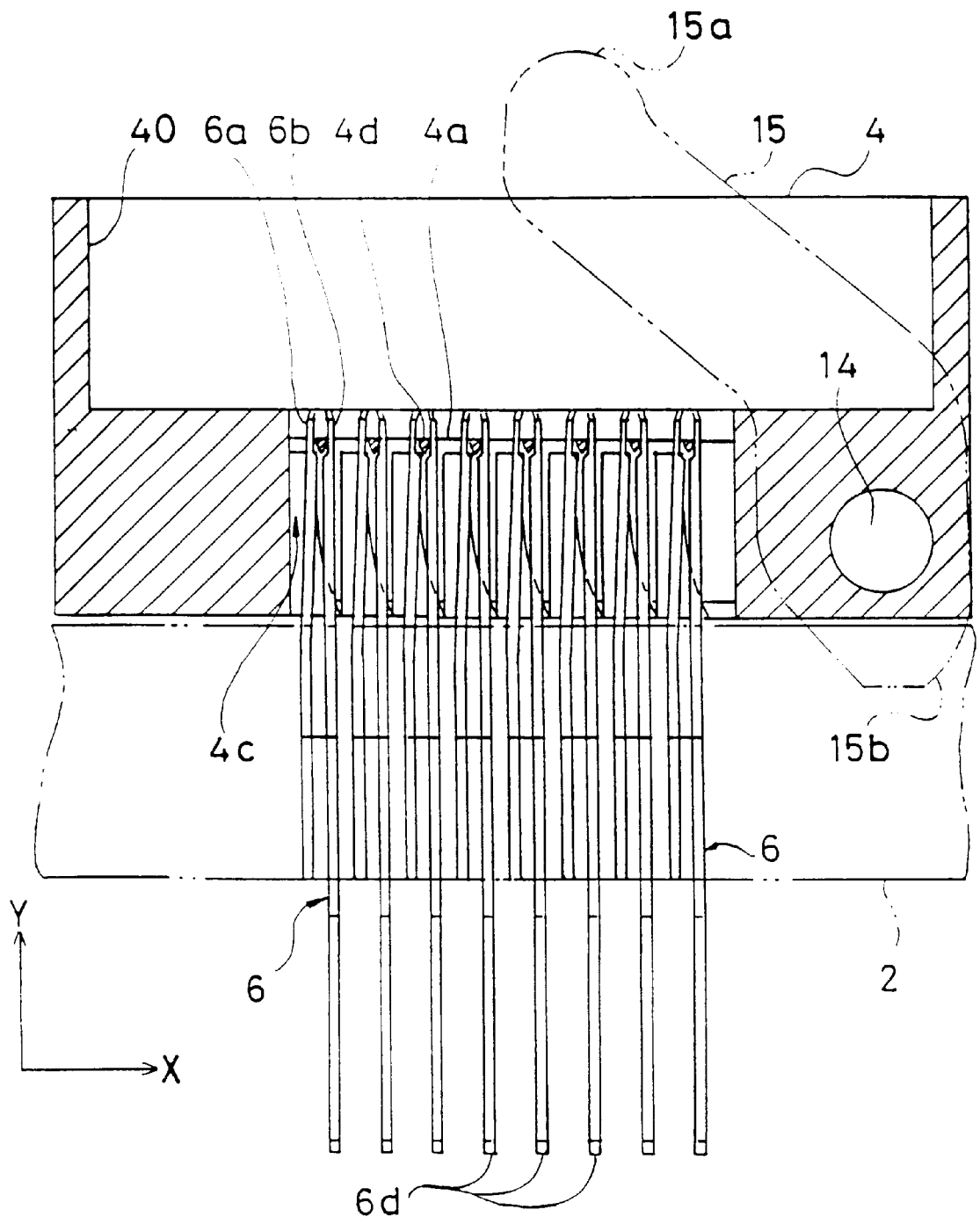
FIG. 8 is a cross sectional view taken along line 8/9—8/9 in FIG. 7(a) with the arms of the contact shown in a closed state.
Figure 9:
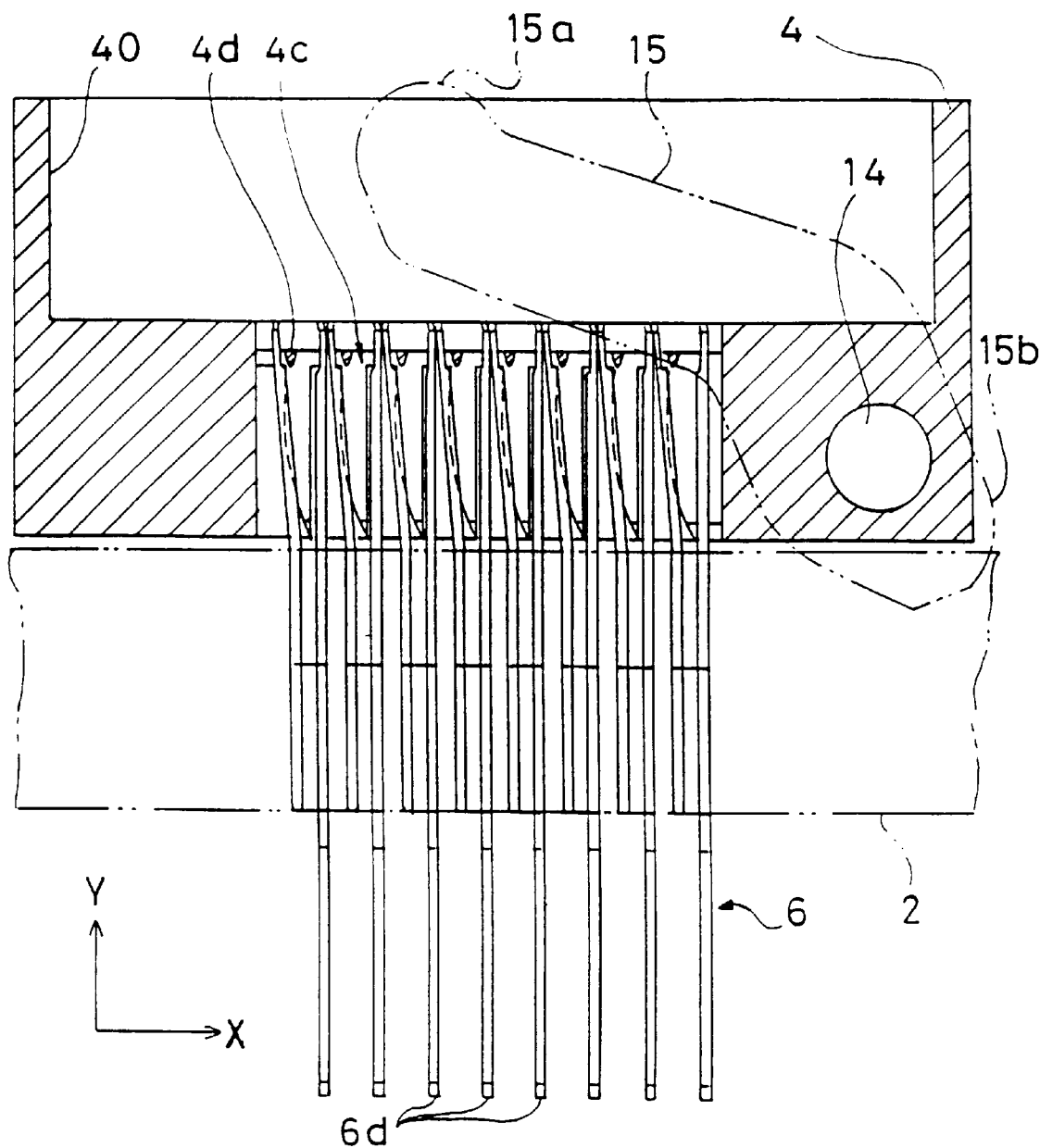
FIG. 9 is a cross sectional view taken along line 8/9—8/9 in FIG. 7(a) with the arms of the contact shown in an open state.
Figure 10:
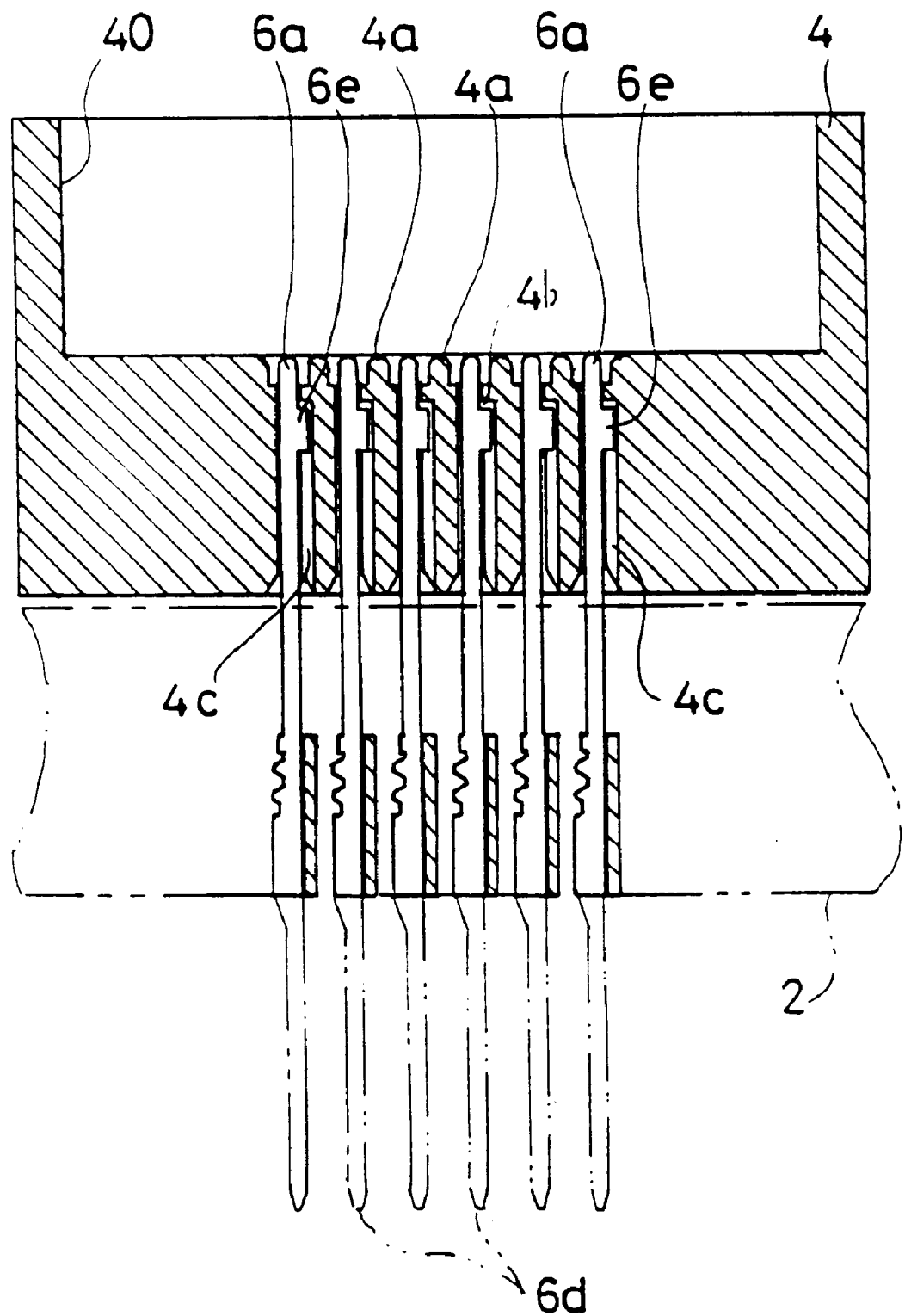
FIG. 10 is a cross sectional view taken along line 10—10 in FIG. 7(a)
Figure 11A:
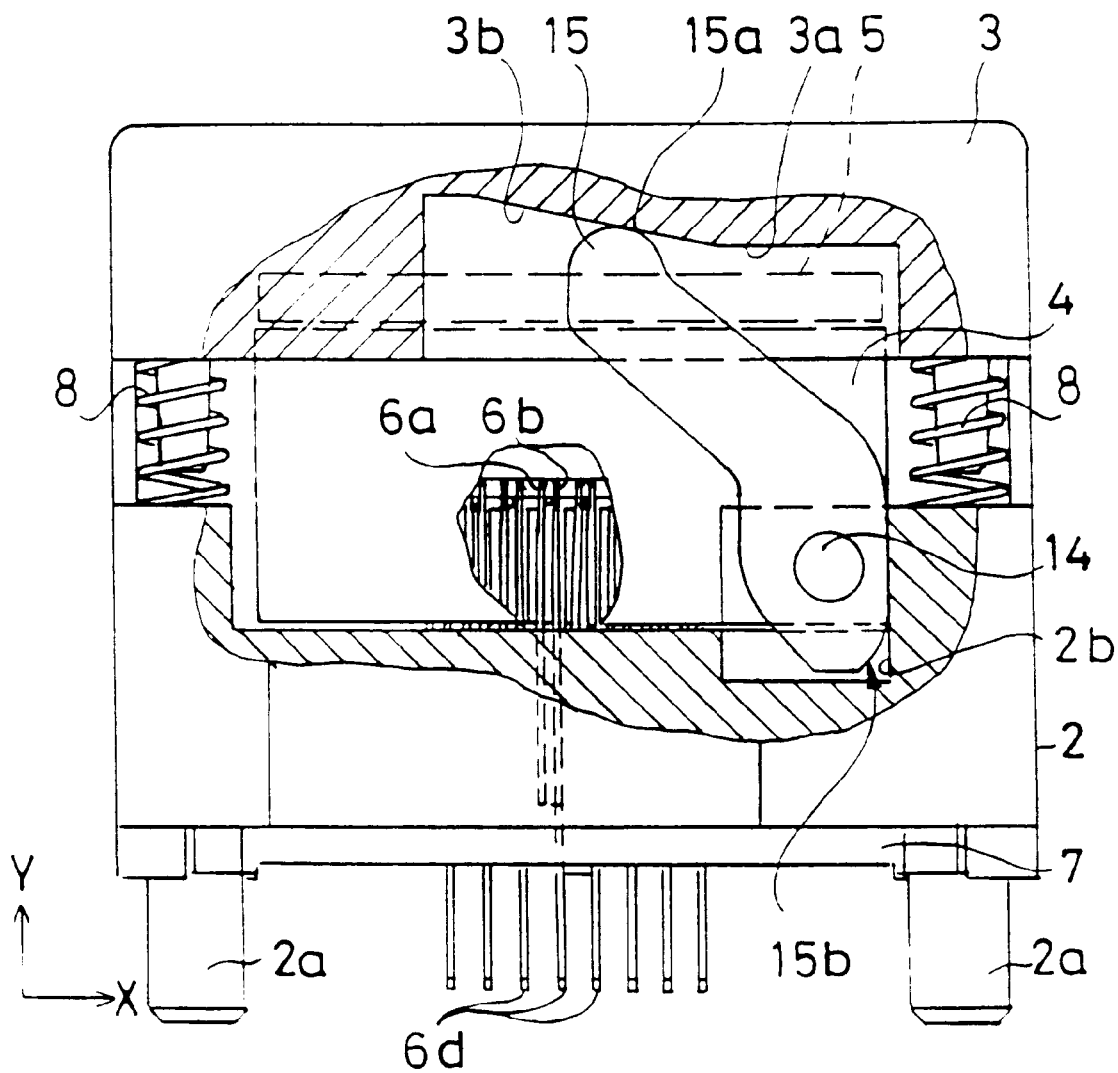
FIGS. 11(a), 11(b) are partial cross sectional views, partly broken away, showing the interior structure of the socket of FIGS. 1 and 2, with FIG. 11(a) showing the cover at a position of an upper limit and FIG. 11(b) showing the cover at a position of a lower limit.
Figure 11B:
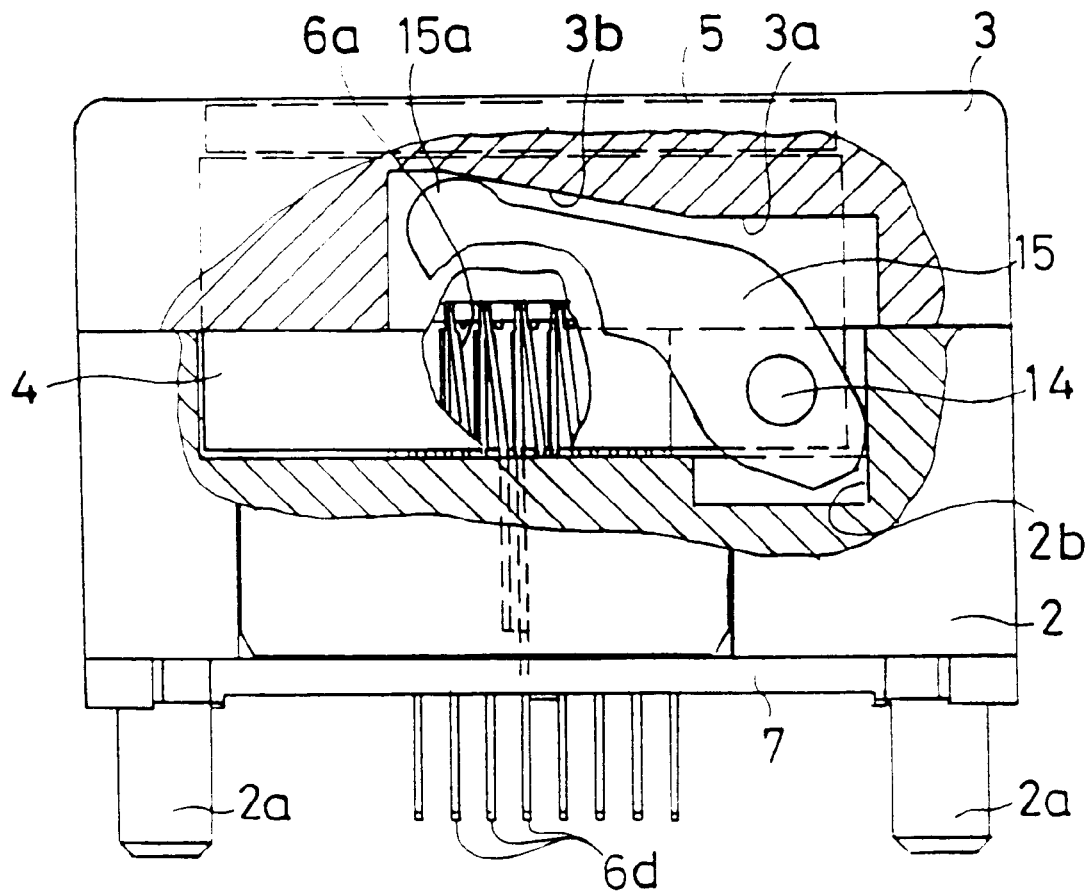
Figure 13A:
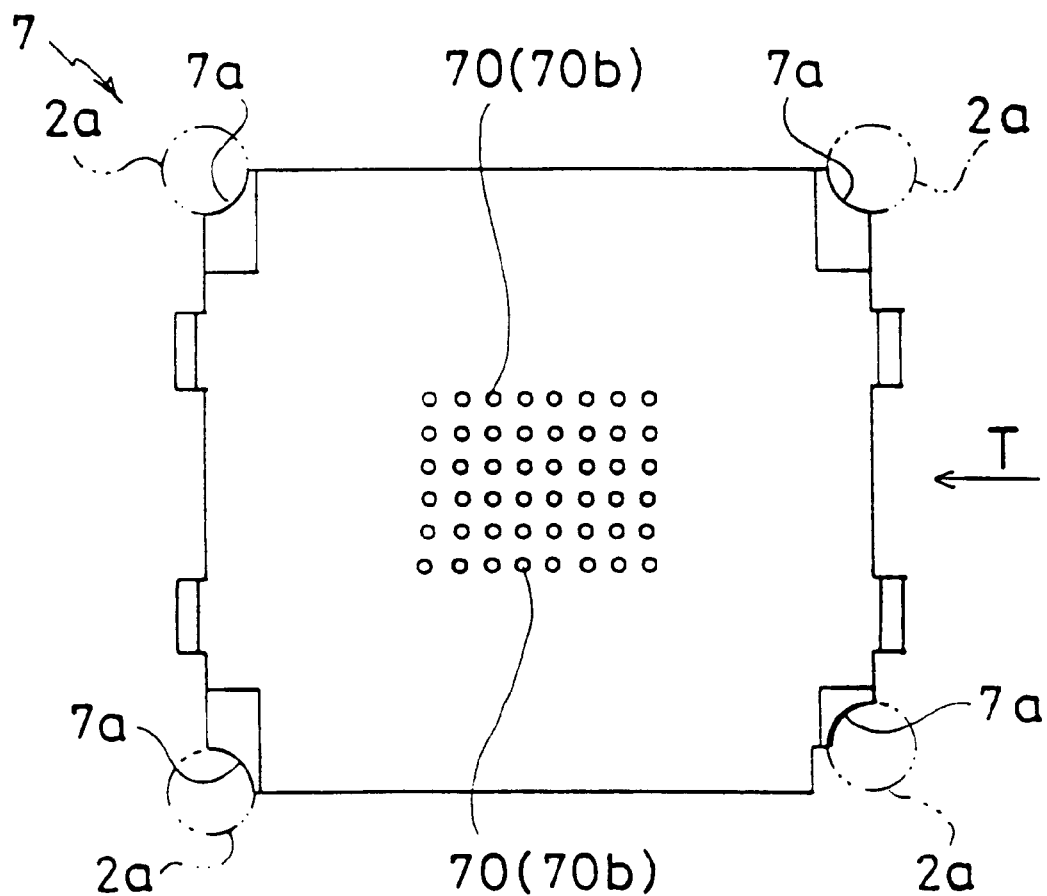
FIG. 13(a) is a bottom plan view of the FIG. 12 lead guide and FIG. 13(b) is an elevational view of the lead guide shown in FIG. 13(a) as viewed in the direction indicated by an arrow mark T.
Figure 13B:
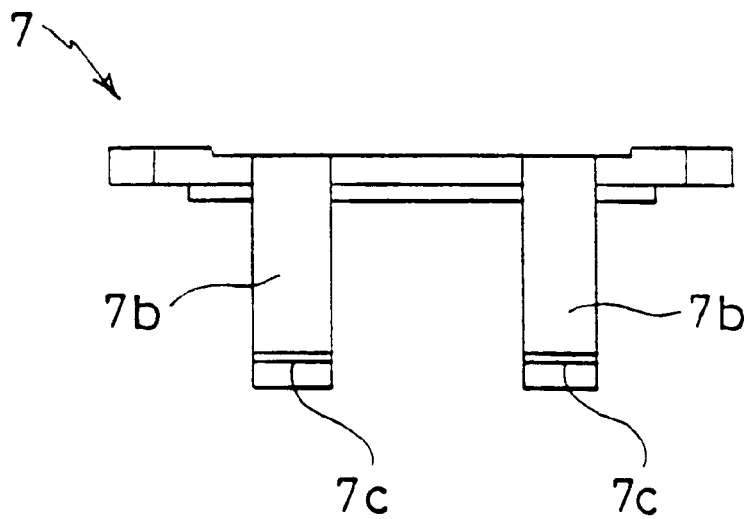
Figure 14A:
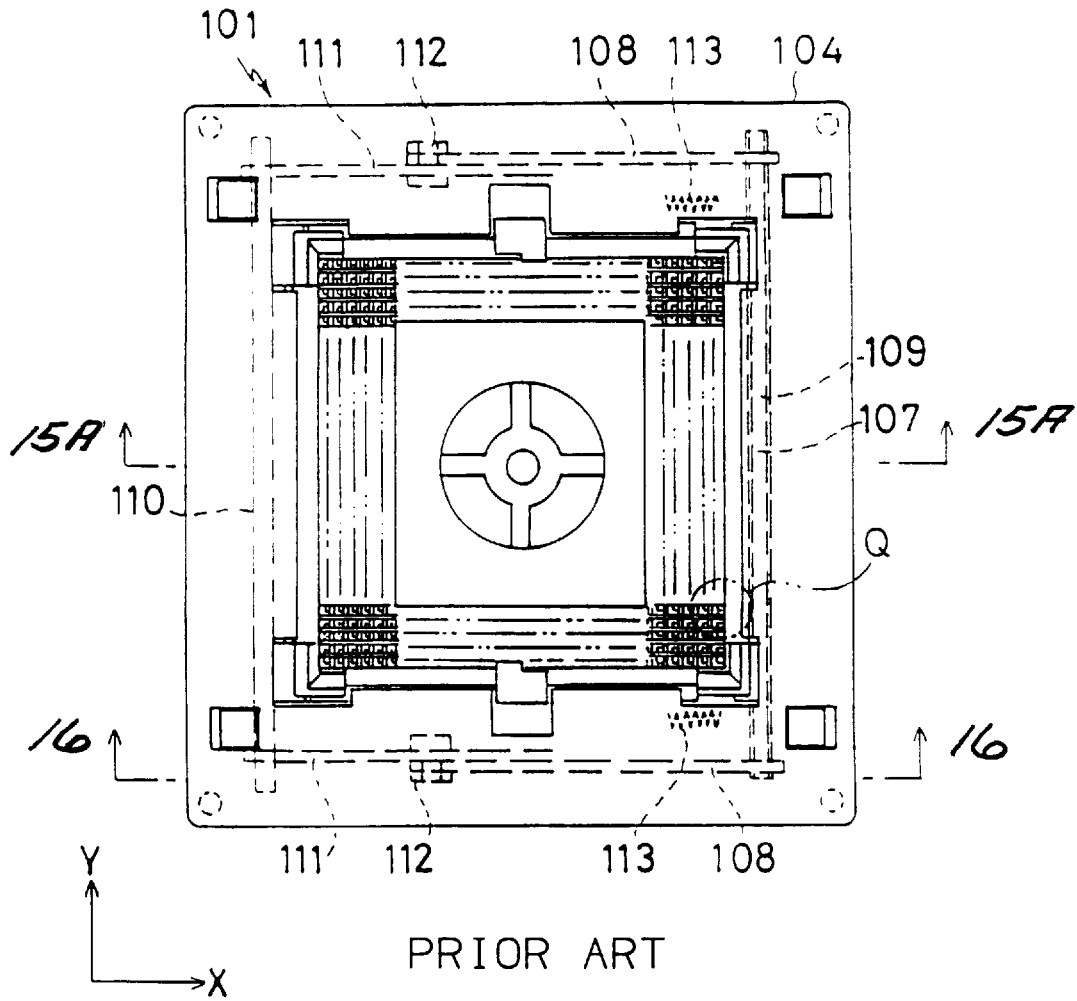
FIG. 14(a) is a top plan view of a socket made according to the prior art and FIG. 14(b) is an enlarged view of portion Q of FIG. 14(a)
Figure 14B:
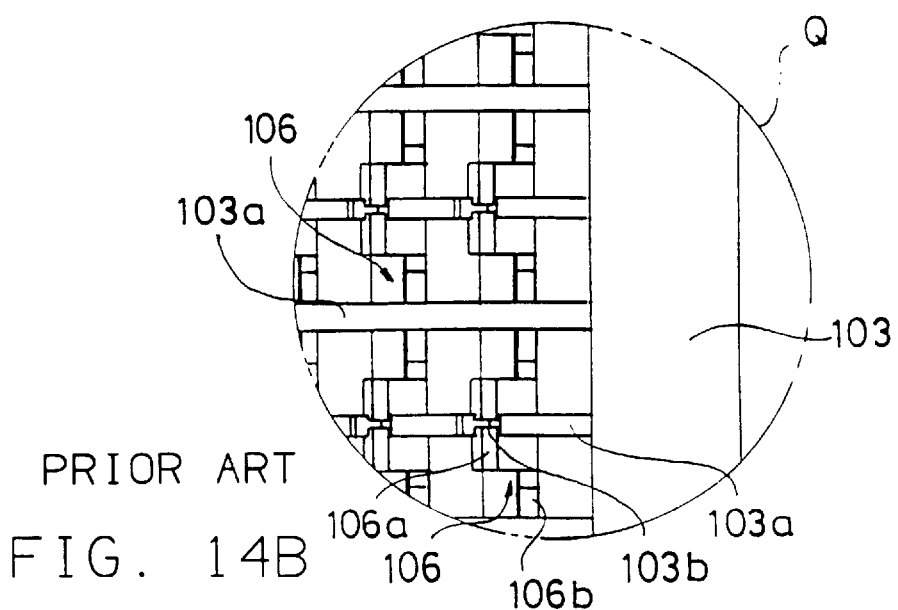
Figure 15A:
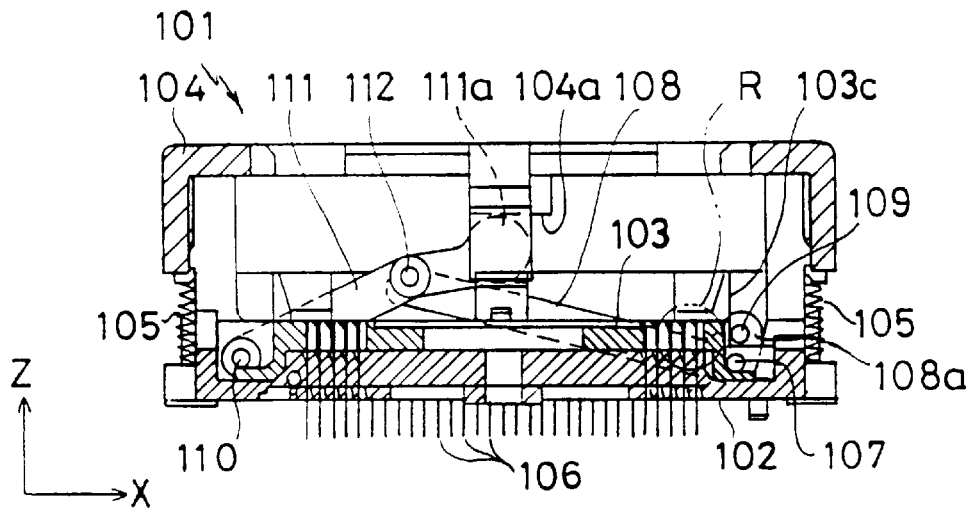
FIG. 15(a) is a cross sectional view taken along line 15(a)—15(a) in FIG. 14(a) and FIG. 15(b) is an enlarged view of portion part R in FIG. 15(a)
Figure 15B:
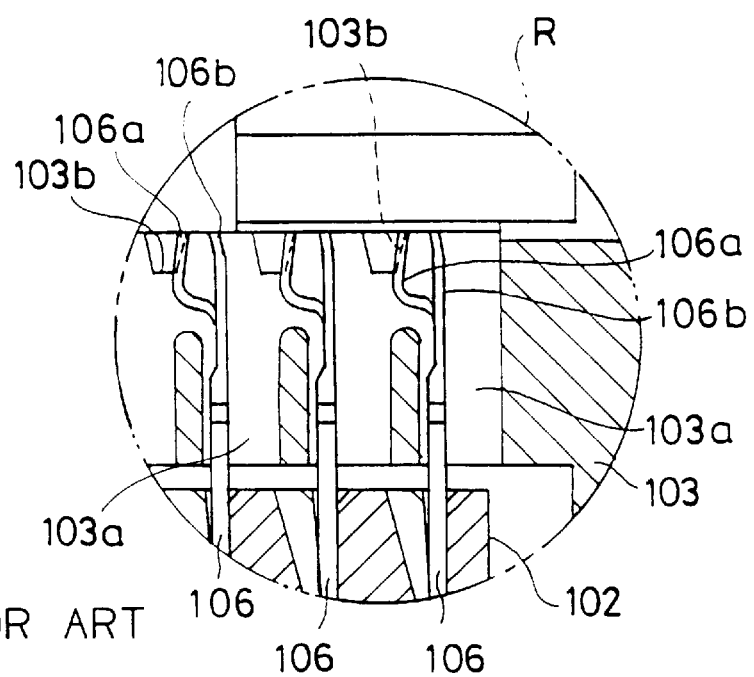

As shown in FIGS. 7(a), 7(b), a plurality of through holes 4c are formed at the center of slide member 4 so as to correspond to the position of the solder ball terminal leads of BGA package 9. In addition, contacts 6 are fixed at the prescribed position in base 2 and arms 6a and 6b of each contact 6 are accommodated in each through hole 4c of the slide member 4, as shown in FIGS. 8 through 10. Each contact 6 is fixedly mounted to base 2 in such a way that arms 6a and 6b sandwich the lattice part 4d of the slider as shown in FIG. 7(b) so that the respective pressure contact part 60 extends out of each hole 4c. A plurality of partition walls 4a extending in the direction of the X axis are formed, with each through hole 4c disposed between partition walls 4a. The top of each contact 6 is made to be approximately the same height as that of each partition wall 4a. As shown in FIGS. 7(b) and 10, a respective engaging groove 4b which engages with the protrusion 6e of arm 6a of each contact pair is formed on slide member 4. Each engaging groove 4b is positioned in the vicinity of each through hole 4c of slide member 4 with arms 6a and 6b in the closed state. Slide member 4 slides in the direction of the X axis by the mechanism which will be described below. As shown in FIG. 1(a), slide member 4 is biased in the X+ direction by a compression coil spring 12. As shown in FIGS. 1(a) and 2, a pair of latches 13 are provided for holding BGA package 9. Latches 13 rotate along with the vertical movement of cover 3, moving away from the surface of the slide member 4 in connection with the mounting of BGA package 9. A shaft 14 extends through slide member 4 and a lever member 15 is pivotably mounted at each end of shaft 14. Shaft 14 extends along the Y axis shown in FIG. 7(a), directly across the sliding direction on the side being pressed toward base 2 by the spring force of the compression coil spring 12 of slide member 4, as shown in FIGS. 7(a), 8, 9 and 11(a) and 11(b). Lever member 15 is made of a suitable metal such as stainless steel and is formed in the shape of an L. The tip 15a of lever member 15 is formed in an arc shape. As shown in FIG. 9, its lower portion 15b extends beyond the rear portion of slide member 4 upon rotation of lever member 15. As shown in FIGS. 11(a) and 11(b), a groove 3a having an inclined portion 3b is formed in cover 3 which receives tip 15a of lever member 15. Slide member 4 is biased against reaction part 2b of base 2 by compression coil springs 12 as shown in FIG. 11(a) when the cover 3 is not depressed. In this state, tip 15a of lever member 15 is in engagement with the inclined portion 3b of groove 3a of cover 3. In addition, arms 6a and 6b of each contact 6 are in the closed state.

When cover 3 is pressed down from this state in the Y-direction, as seen in FIGS. 11(a), 11(b), lever member 15 rotates in a counter clock-wise direction, with its lower portion 15b extending beyond the rear portion of slide member 4. As a result of this, lever member 15 applies a force against reaction surface part 2b of base 2, with a consequence that slide member 4 slides in the X– direction in opposition to the spring force of compression coil spring 12 and concomitantly, arm 6a moves in the X– direction due to the engagement between the engaging groove 4b of slide member 4 and protrusion 6e of arm 6a, thereby separating arms 6a and 6b. In this state, the latch is moved against the bias of springs 8 by the cover and, as BGA package 9 is inserted through opening 3a of cover 3, the package can be placed on slide member 4.

Figure 6C:
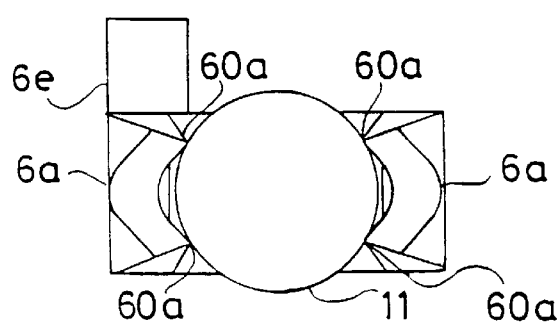
FIG. 6(c) shows the FIG. 6(b) contacts sandwiching a solder ball terminal lead.

When the downward force of cover 3 is removed, an opposite action occurs and arms 6a and 6b of each contact 6 are closed and, as shown in FIG. 6(c), each solder ball 11 of BGA package 9 is compressively contacted by the compressive contact part 60 of a respective pair of arms 6a and 6b. Arms 6a and 6b are constructed to face each other so that solder balls 11 of BGA package 9 are firmly sandwiched by the compressive contact part 60 of arms 6a and 6b. As a result, a satisfactory electrical connection is obtained. In addition, the socket can easily accommodate small pitches as the adjoining contacts 6 can be closely arranged. In view of the fact that sharp protrusions 60a are formed at the compressive contact part 60 of each contact 6, moreover, even in the case where an oxide film is formed on solder balls 11 of BGA package 9, the oxide film can be broken by protrusions 60a, thereby obtaining a better electrical connection. As described, one of the arms, 6a, is bent generally in the form of a bow, but with a sharper bend. The compressive contact parts 60 of arms 6a and 6b can be made to face each other accurately with the bending of arm 6a, along with the bending of mounting part c. As a result of this, it becomes possible to efficiently manufacture the sockets which are capable of satisfactory electrical connection.

Lead guide 7, see FIGS. 12(a)–12(c), 13(a), 13(b), is made in a rectangular configuration of a suitable resin such as polyether imide or the like. An arcshaped engaging part 7a is formed at four corners of lead guide 7 for engagement with respective positioning parts 2a formed on base 2. Guide holes 70 are formed at the center of lead guide 7 at a position corresponding to the holes (not shown in the drawing) for the insertion of respective connecting lead parts 6d of contacts 6 on the circuit substrate, not shown in the drawing. These guide holes 70 are formed with the opening 70a on the top surface side being larger than the opening part 70b on the lower or back side to facilitate the insertion of the connecting lead part of contact 6. Stop elements 7b, having a claw 7c for engaging base 2, are integrally formed at two opposing edges of lead guide 7. Lead guide 7 is attached at the bottom of the base with engaging parts 7a guided by positioning parts 2a of the base. At the bottom of base 2, insertion holes, not shown in the drawing, are formed so that stop elements 7b of lead guide 7 may be inserted into them. Because of this, lead guide 7 can move up and down along positioning parts 2a of base 2 with the connecting lead part 6d of each contact running through a respective guide hole 70. As shown by the dashed line in FIG. 1(b) and 2, lead guide 7 is stopped at a position below the bottom of the base 2. When socket 1 is loaded on the circuit substrate, not shown in the drawing, positioning parts 2a formed at the bottom of base 2 are inserted into the positioning holes of the circuit substrate and socket 1 is pressed downwardly. Because of this, lead guide 7 moves upwardly along the positioning parts 2a of base 2 and the connecting lead parts 6d of the contact 6 that extend out of guide holes 70 of lead guide 7. As guide holes 70 are formed at positions which correspond to the insertion hole of respective connecting parts 6d of contacts 6 on the circuit substrate, even if a connecting part 6d of a contact 6 were to be somewhat bent, it becomes possible for its tip to be guided to the right location, thereby making it possible for the socket 1 to be easily loaded.

It will be appreciated by those skilled in the art that the invention is not limited to the particular embodiment illustrated and discussed herein. For example, lever member 15 for moving slide member 4 may have various shapes, provided that such shape does not deviate from the scope of this invention. The invention can be used not only for sockets for a burn-in test but also can be used for sockets for electrical property tests. It can further be used in packages having various lead terminals, provided that the lead terminals can be held by facing arm shaped contact parts. Accordingly, the invention described above provides a socket having a simple structure at a low cost which can be easily loaded on the circuit substrate and which is capable of accurate electric connections for electric parts having small connecting terminals of small or fine pitches. It is intended that the scope of the invention be determined by the appended claims.

What is claimed:

1. Socket apparatus for removably receiving an electric part having a plurality of terminal leads arranged in a selected pattern comprising a base, a slide member mounted on the base and being movable back and forth between first and second extremities along a selected direction, the slide member having a plurality of holes therethrough forming slide member walls arranged in the selected pattern and having a groove formed in a wall of each hole of the slide member, contact makers each having a mounting portion mounted in the base in the selected pattern with an elongated lead portion extending downwardly through the base for connection to a circuit board and a pair of first and second elongated arms extending upwardly from the mounting portion to a contact portion in face to face relationship with one another, one arm of each pair having a protrusion receivable in the respective groove of the slide member to move the one arm of the respective contact maker so that in the first extremity the arms are open forming a space for receipt of a respective solder ball terminal lead of the electric part in the second extremity the arms of each pair of contact member are brought into compressive electrical engagement with a respective terminal lead received therebetween, and a lead guide having a wall formed with a plurality of holes formed therethrough, the holes each having an enlarged upper portion and a smaller lower portion, and positioning members projecting downwardly from the base receivable in positioning apertures of a substrate to which the socket is to be mounted so that upon placing the positioning members in the positioning aperture and the lead guide being received under the base the contact maker leads, even if slightly bent, can be received in the enlarged upper portion and moved into a desired position by the smaller lower position upon movement of the guide lead toward the base.

2. Socket apparatus according to claim 1, further including a spring member that biases the slide member in the direction of the second extremity and a lever member which is rotatably mounted on the slide member and protrudes beyond the slide member upon rotation to place a force on a reaction surface of the main socket body to cause the slide member to move against the bias of the spring member.

3. Socket apparatus for removably receiving an electric part having a plurality of solder ball terminal leads arranged in a selected pattern comprising a base, a slide member mounted on the base and being movable back and forth between first and second extremities along a selected direction, the slide member having a plurality of holes therethrough forming slide member walls arranged in the selected pattern and having a groove formed in a wall of each hole of the slide member, contact makers each having a mounting portion mounted in the base in the selected pattern with an elongated lead portion extending downwardly through the base for connection to a circuit board and a pair of first and second elongated arms extending upwardly from the mounting portion to a contact portion in face to face relationship with one another, the arms of each pair movable toward and away from each other and received in a slide member hole with one arm of each pair received in one hole and the second arm of each pair received in an adjacent hole with a portion of the slide member wall disposed between the arms of each pair, one arm of each pair having a protrusion receivable in the respective groove of the slide member to move the one arm of the respective contact maker so that in the first extremity the arms are open forming a space for receipt of a respective solder ball terminal lead of the electric part in the second extremity the arms of each pair of contact member are brought into compressive electrical engagement with a respective solder ball terminal lead received therebetween.

4. A socket apparatus according to claim 1 further comprising a lead guide having a wall formed with a plurality of holes formed therethrough, the holes each having an enlarged upper portion and a smaller lower portion, the lead guide having upwardly extending legs receivable in mating apertures formed in a lower surface of the base, and positioning members projecting downwardly from the base receivable in positioning apertures of a substrate to which the socket is to be mounted so that upon placing the positioning members in the positioning aperture and the lead guide being received under the base with the lead guide legs received in the mating apertures in the base the contact maker leads, even if slightly bent, can be received in the enlarged upper portion and moved into a desired position by the smaller lower position upon movement of the lead guide toward the base.

5. Socket apparatus according to claim 3 in which the contact arms are formed with free distal end portions having a center portion between two ends of each contact arm bent away from the facing contact arm so that each distal end portion of a pair form a generally concave configuration facing the opposite contact arm for improved compressive electrical engagement with generally spherical shaped solder ball terminals and the two edges of each contact arm end form sharp oxide film piercing points.

6. Socket apparatus according to claim 3 in which the mounting portion is a generally U-shaped portion having first and second legs, the first contact arm extending upwardly from one leg and the second contact arm extending upwardly from the other leg.

\* \* \* \* \*